(12) United States Patent
Sattel

(10) Patent No.: US 11,621,124 B2
(45) Date of Patent: Apr. 4, 2023

(54) AIR-CORE INDUCTOR ASSEMBLY

(71) Applicant: KONINKLIJKE PHILIPS N.V., Eindhoven (NL)

(72) Inventor: Timo Frederik Sattel, Norderstedt (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 303 days.

(21) Appl. No.: 16/769,505

(22) PCT Filed: Dec. 3, 2018

(86) PCT No.: PCT/EP2018/083249
§ 371 (c)(1),
(2) Date: Jun. 3, 2020

(87) PCT Pub. No.: WO2019/110457
PCT Pub. Date: Jun. 13, 2019

(65) Prior Publication Data
US 2020/0388436 A1 Dec. 10, 2020

(30) Foreign Application Priority Data
Dec. 7, 2017 (EP) .................................... 17205848

(51) Int. Cl.
*H01F 38/30* (2006.01)
*H01F 27/28* (2006.01)
(Continued)

(52) U.S. Cl.
CPC .......... *H01F 38/30* (2013.01); *G01R 15/181* (2013.01); *G01R 19/0092* (2013.01);
(Continued)

(58) Field of Classification Search
CPC .... G01R 19/00; G01R 19/0092; G01R 15/18; G01R 15/181; H01F 38/20; H01F 38/30;
(Continued)

(56) References Cited

U.S. PATENT DOCUMENTS 3,041,523 A * 6/1962 Kuba ........................ G05F 3/06
323/309
2007/0114992 A1 5/2007 Muniraju
(Continued)

FOREIGN PATENT DOCUMENTS

| CN | 200983314 Y | 11/2007 |
| CN | 201796075 U | 4/2011 |
| WO | WO2013144742 A1 | 10/2013 |

OTHER PUBLICATIONS

PCT International Search Report, International application No. PCT/EP2018/083249, dated Mar. 7, 2019.

*Primary Examiner* — Jermele M Hollington
*Assistant Examiner* — Suresh K Rajaputra
(74) *Attorney, Agent, or Firm* — Larry Liberchuk

(57) ABSTRACT

Modern X-ray generators are required to deliver a peak power between 30 kW and 120 kW. This requirement places demanding constraints on the design of the power inverters used to supply such X-ray generators, at the same time that there exist industry incentives to reduce the size of X-ray generators. An trend towards increased frequencies of switching operation in the power stage of modern X-ray generators makes it possible to use air-core inductors, rather than magnetic-core inductors. This application discusses an air-core inductor assembly having an integral current sensor. According to this application, a current sensor can be more accurately provided, which does not drift in position over time, and in a way which reduces the overall bill of materials.

11 Claims, 4 Drawing Sheets

(51) Int. Cl.
  *G01R 19/00*   (2006.01)
  *H05K 1/18*    (2006.01)
  *G01R 15/18*   (2006.01)

(52) U.S. Cl.
  CPC ........... *H01F 27/2823* (2013.01); *H05K 1/18* (2013.01); *H01F 2038/305* (2013.01)

(58) Field of Classification Search
  CPC .......... H01F 27/28; H01F 38/32; H01F 38/28; H01F 2038/305; H01F 27/2823; H05K 1/18
  See application file for complete search history.

(56) References Cited

U.S. PATENT DOCUMENTS

| | | |
|---|---|---|
| 2008/0106254 A1 | 5/2008 | Kojovic |
| 2011/0129067 A1 | 6/2011 | Fukuwara |
| 2012/0268114 A1 | 10/2012 | Disselnkotter |
| 2014/0253109 A1 | 9/2014 | Singh |
| 2015/0022198 A1* | 1/2015 | David ................... G01R 33/07 324/252 |
| 2015/0228393 A1 | 8/2015 | Waffler |
| 2016/0124025 A1 | 5/2016 | Scholz |
| 2019/0101572 A1* | 4/2019 | Mattmiller ........... G01R 15/181 |

* cited by examiner

AIR-CORE INDUCTOR ASSEMBLY

FIELD OF THE INVENTION

The present invention relates to an air-core inductor assembly, a method for manufacturing an air-core inductor assembly, a resonant power supply assembly, a resonant multi-stage filter, a computer program element, and a computer readable medium.

BACKGROUND OF THE INVENTION

Modern X-ray generators are required to deliver a peak power between 30 kW and 120 kW. This requirement places demanding constraints on the design of the power inverters used to supply such X-ray generators.

The commercialisation of new semiconductor switching elements fabricated from silicon carbide (SiC) and gallium nitride (GaN) enable an increase in the switching frequency of X-ray generators to be contemplated, even for currents of several hundreds of Amperes. The foreseen increase in the operating frequency of such converters creates opportunities for improvements in the design of components used in the power inverters of an X-ray generator.

CN201796075U discusses a coil module for a current sensor, which comprises an annular magnetic core with an air gap, a coil, and a main circuit board. Such a coil module can, however, be further improved.

SUMMARY OF THE INVENTION

There is, therefore, a need to improve inductor coil design.

The object of the present invention is solved by the subject-matter of the appended independent claims. Further embodiments are incorporated in the dependent claims and description.

A first aspect provides an air-core inductor assembly comprising:
 a printed circuit board comprising a current sensor; and
 a portion of a first air-core inductor coil mounted on the printed circuit board.

The current sensor is formed integrally with the printed circuit board, and a portion of the first air-core inductor coil is arranged in proximity to the current sensor, to provide an electromagnetic coupling in use, thus enabling the current sensor to provide a measurement of the flux present in the first air-core inductor coil.

Accordingly, it is possible to realise pickup coil windings using a printed circuit board. This reduces the "bill of materials" cost of an air-core inductor assembly by removing the need for a separate current-sense coil. Furthermore, the flexibility of printed circuit board design techniques enable many different configurations of pickup coil windings to be realised dependent on the requirements of specific design. Therefore, for certain size and/or configuration of air-core coil, it is possible to provide a more effective pickup coil (current sensor) to assess the flux strength inside of the air-core inductor.

Optionally, the current sensor is a printed circuit board trace.

Accordingly, a separate current sensor is not required, reducing the bill of materials cost of an air-core inductor assembly.

Optionally, the printed circuit board trace comprises a loop, spiral, or square spiral track, inside the portion of the printed circuit board defined by the outer diameter of the portion of the first air-core inductor coil.

Accordingly, the shape of the current sensor may be adapted in many different ways to the specific cross-section of the end of an air-core inductor, to maximise the attainable flux linkage between the air-core inductor and the current sensor. This improves the signal-to-noise ratio of a flux linkage measurement from the air-core inductor.

Optionally, the printed circuit board trace forms a loop, spiral, or square spiral track, outside the portion of the printed circuit board defined by an outer diameter of the portion of the first air-core inductor coil, until a terminal diameter, such that the current sensor provides an electromagnetic coupling to portions an outer side of the portion of the first air-core inductor coil.

Accordingly, although the flux linkage is strongest inside the air-core of the air-core inductor, the current sensor can be designed inside the printed circuit board to capture additional flux present proximally to an exterior side of the air-core inductor.

Optionally, the printed circuit board further comprises a through-hole inside the portion of the printed circuit board defined by the outer diameter of the portion of the first air-core inductor coil. A wire terminal of the first air-core inductor coil is routed via the through-hole to the opposite side of the printed circuit board.

Accordingly, the first air-core inductor coil can be conveniently terminated on the opposite side of the printed circuit board, or connected to a second inductor coil on the opposite side of printed circuit board. The current sensor can be provided to surround the through-hole, enabling the flux linkage to be measured inside the air-core of the inductor.

Optionally, the printed-circuit board is a multiple-layer printed circuit board. The current sensor is formed from printed circuit board traces located on a plurality of the multiple layers, wherein the printed circuit board traces are connected in a series or parallel configuration using printed circuit board vias between the layers.

Accordingly, the flux-pickup characteristics of the current sensor are improved by providing a plurality of pickup coils in a simple way, by utilising the mesa structure of a multi-layer printed circuit board.

Optionally, the air-core inductor assembly further comprises a first coil support. The first coil support is supported on the printed circuit board, and the first inductor coil is supported on the coil support.

Accordingly, the air-core inductor assembly is stably supported.

Optionally, the air-core inductor assembly further comprises a second inductor coil. The second inductor coil is disposed on the opposite side of the printed circuit board to the first air-core inductor coil, and is in alignment with it, to thus enable a flux coupling between the first air-core inductor coil and second inductor coil.

Optionally, the printed circuit board further comprises an instrumentation amplifier. The instrumentation amplifier is configured to amplify a current pickup signal from the current sensor and to output it for use by a feedback circuit.

Accordingly, a current-pickup signal representing the flux linkage in, or proximate to, the core of the air-core inductor can be amplified and/or impedance matched for the further use of a power supply monitoring circuit.

According to a second aspect, there is provided a resonant power supply assembly, comprising the air-core inductor assembly according to the first aspect or its optional embodiments.

Accordingly, the bill of materials cost of the resonant power supply assembly can be simplified, while still enabling flux strength feedback characteristics of inductors used in the resonant power supply assembly to be obtained.

According to a third aspect, there is provided a resonant multi-stage filter, comprising:

a first air-core inductor assembly according to the first aspect or its optional embodiments; and a second air-core inductor assembly according to the first aspect or its optional embodiments.

The first air-core inductor assembly is connectable in series with the load element, and the second air-core inductor assembly is connectable in parallel with the load element, enabling a complex power metric to be calculated based on the measurement of the flux provided by the current sensors of the first and second air-core inductor assemblies.

Accordingly, the bill of materials cost of a resonant multi-stage filter can be reduced.

According to a fourth aspect, there is provided a method for manufacturing an air-core conductor assembly comprising:

a) manufacturing a printed circuit board having a current sensor formed integrally with the printed circuit board;

b) providing a portion of a first air-core inductor coil mounted on the printed circuit board, wherein a portion of the first air-core inductor coil is arranged in proximity to th current sensor, to provide an electromagnetic coupling in use.

Optionally, the current sensor is formed in a plurality of layers of a multi-layered printed circuit board.

Optionally, the printed circuit board trace is provided as a loop, spiral, or square spiral track, inside the portion of the printed circuit board defined by the outer diameter of the portion of the first air-core inductor coil.

According to a fifth aspect, there is provided a computer program element comprising instructions which, when executed, enable a printed circuit board design program to generate instructions for manufacturing a printed circuit board comprising a current sensor and mounting pads for a first air-core inductor coil mounted on the printed circuit board, wherein the current sensor is formed integrally with the printed circuit board, and wherein the mounting pads for mounting the first air-core inductor coil are arranged in proximity to the current sensor, to provide an electromagnetic coupling between the current sensor and the first air-core inductor coil in use, thus enabling the current sensor to provide a measurement of the flux present in the first air-core inductor coil.

According to a sixth aspect, there is provided a computer readable medium having stored the computer program element of the fifth aspect.

According to a seventh aspect, there is provided a kit of parts comprising a printed circuit board and a first air-core inductor coil as defined in the first aspect, or its optional embodiments.

In the following application, the term "inductor coil" refers to a wire having a plurality of windings, optionally formed on a coil support. The windings of the coil may optionally be around a straight-line axis, but more usually optionally are wound around a semi-circular axis with respect to a printed circuit board base that the inductor coil is mounted on. The provision of a coil support is not essential, and depends on the rigidity of the wire gauge used when manufacturing the inductor, for example.

In the following application, the term "current sensor" refers to a means capable of monitoring the flux strength inside, or closely to, an air-core inductor. In the present application, this includes a printed circuit board trace made from copper, for example. A varying flux in the core of the air-core inductor will, following the Maxwell-Faraday equation, induce a negative voltage in the printed circuit board trace proportional to the size of the current flowing through the inductor coil, and proportional to the rate of change of the flux variation (power switching frequency). Optionally, the current sensor can also be implemented as a "Hall effect sensor", for example.

In the following application, an example of a computer data format which could form the "computer program element" is a data format used with a common printed circuit board design program such as ODB++, standard Gerber (RS-274-D), extended Gerber (RS-274X), EDIF, or ISO 10303-210.

It is, therefore, a basic idea of the invention to monitor the flux strength inside the core of an air-core inductor assembly using a current sensor which can be manufactured in a printed circuit board manufacturing process.

These, and other aspects of the present invention will become apparent from, and elucidated with reference to, the embodiments described hereinafter.

BRIEF DESCRIPTION OF THE DRAWINGS

Exemplary embodiments of the invention will be described with reference to the following drawings.

DETAILED DESCRIPTION OF EMBODIMENTS

Modern X-ray generators are designed to deliver a peak power in the range of 30 kW to 120 kW. State of the art power inverters operate at frequencies in the range 20 kHz to 100 kHz. In the quest to reduce the size of X-ray equipment, lower capacitor transformer and inductor values are desired. To minimise losses, it is further known to use resonance inverters in the power supply stages of X-ray power supply circuits.

Resonance inverters use a resonant inductor and capacitor. The total system inductance is defined by the stray capacitance that is inherent to any high voltage transformer, and an additional resonance inductor. Although designs are known in which the transformer provides the entire inductive component, such solutions have the disadvantage that they are linked to relatively high stray fields, which can produce eddy currents in adjacent parts of the resonant inverter. Furthermore, such designs enlarge the losses in the magnetic core of the transformer.

The availability of new semiconductors such as SiC and GaN implies that in future, power converters in X-ray applications will operate at higher switching frequencies, for example between 100 kHz up to 1 MHz, and carry currents of several hundreds of Amperes.

As operating frequencies increase, the transformer can be optimised for low losses. This requires a separate inductor to be provided for the resonant inverter. At present, inductors for use in such X-ray resonant inverters have been built using magnetic cores. However, such inductors are subject to high losses at the higher operating frequencies, and demand considerable thermal management.

As the frequency of operation increases, the necessary value for inductors decreases to within the range 0.5 µH to 5 µH. Such inductance values can be realised by inductors that do not have a magnetic core, alternatively known as an air-core inductor assembly.

Resonance inverters are typically controlled using a feedback circuit taking as one input a measurement of the current in the resonant circuit. A proxy for the current in the resonant circuit is the magnetic flux measured in an inductor element of the resonant inverter.

Figure 1:
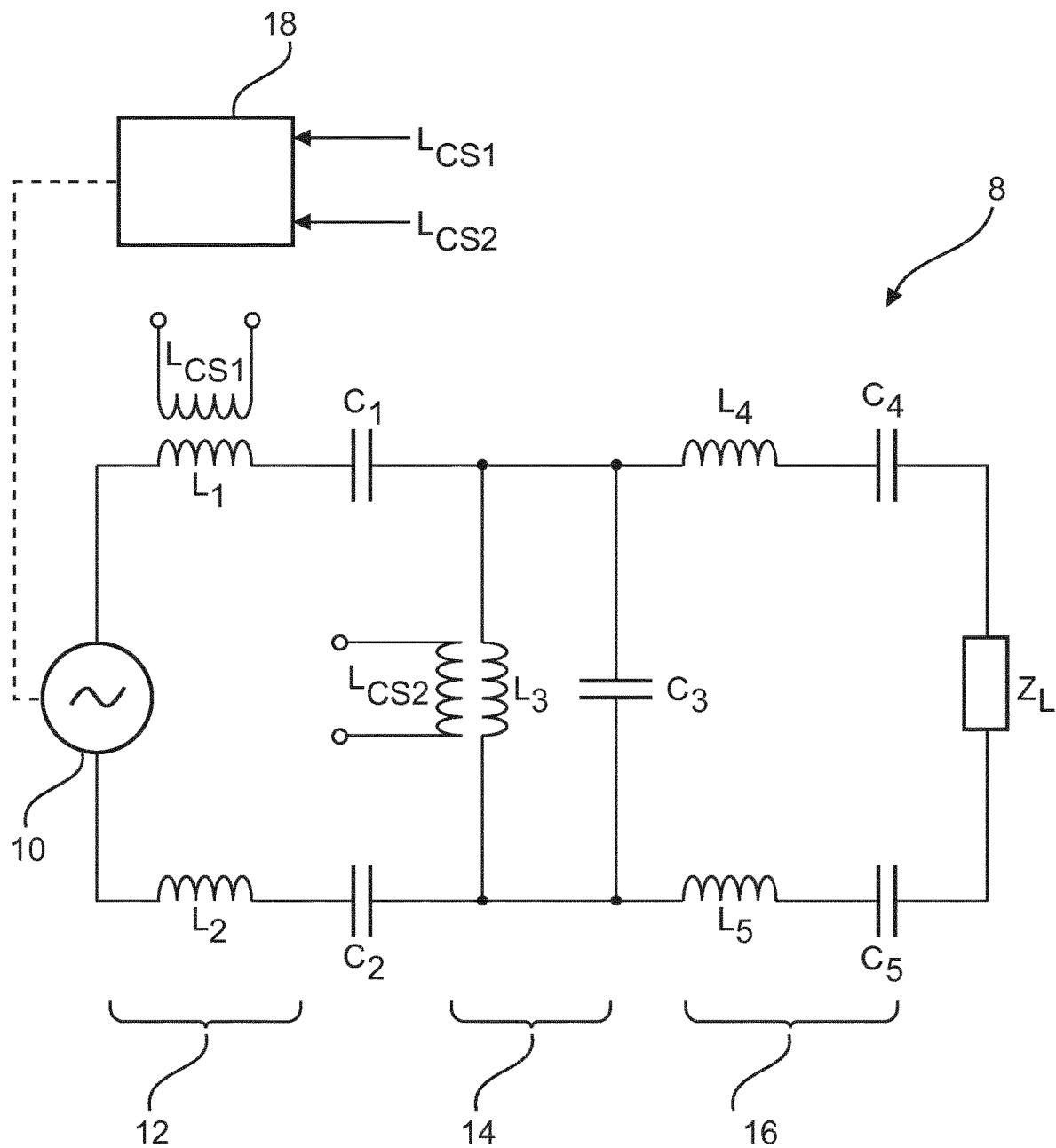
FIG. 1 schematically illustrates a multi-stage filter circuit with two inductors having current sensors.

FIG. 1 illustrates a typical multi-stage filter that could be used in a high-voltage X-ray source power converter. An alternating current source 10 is connected to a first series inductor-capacitor bandpass network formed by inductor $L_1$ and capacitor $C_1$, and inductor $L_2$ and inductor $C_2$, with inductors $L_1$ and $L_2$ forming a first toroid 12. This network is connected in parallel to $L_3$, forming a second toroid 14. The parallel capacitance $C_3$ forms, along with inductor $L_3$, a bandstop network.

Subsequently, series inductor-capacitor networks formed from inductor $L_4$ and capacitor $C_4$, inductor $L_5$ and capacitor $C_5$, comprise a second bandpass filter connected to the load $Z_L$. Inductors $L_4$ and $L_5$ form a third toroid 16. To enable more effective control of the alternating current source 10, a controller 18 provided with current-sense inputs from current sense inductor $L_{CS1}$ and current sense inductor $L_{CS2}$, which are obtained by measuring, in operation, the current induced by inductor $L_1$ in current sense inductor $L_{CS1}$, and inductor $L_3$ in current sense inductor $L_{CS2}$. Thus, current sense inductor $L_{CS1}$ and current sense inductor $L_{CS2}$ are typically placed such that an electromagnetic coupling between the inductors $L_1$, $L_3$, and their respective current sense inductors is present.

Presently, the current sensors formed by current sense inductor $L_{CS1}$ and current sense inductor $L_{CS2}$ in such a circuit topology are provided as discrete coils of wire, for example. This can increase the bill of materials cost of a multistage filter, or air-core inductor circuit assembly. Additionally, use of a discrete coil of wire for the current sensor can lead to complications in the construction of the circuit, such as unpredictability in the orientation the coil of wire. An incorrectly orientated coil of wire can return unexpected current measurement results. Furthermore, a discrete coil of with also causes complications during the automated machine assembly of a power control subsystem Even assuming that the coil of wire is initially placed correctly, it can also become dislodged during servicing or normal operation, leading to system unreliability.

According to a first aspect, there is provided an air-core inductor assembly 20 comprising:
  a printed circuit board 22 comprising a current sensor 26; and
  a portion of a first inductor coil 24 mounted on the printed circuit board 22.

The current sensor 26 is formed integrally with the printed circuit board 22, and a portion 28 of the first inductor coil 24 is arranged in proximity to the current sensor 26, to provide an electromagnetic coupling in use, thus enabling the current sensor 26 to provide a measurement of the flux present in the first inductor coil 24.

Figure 2A:
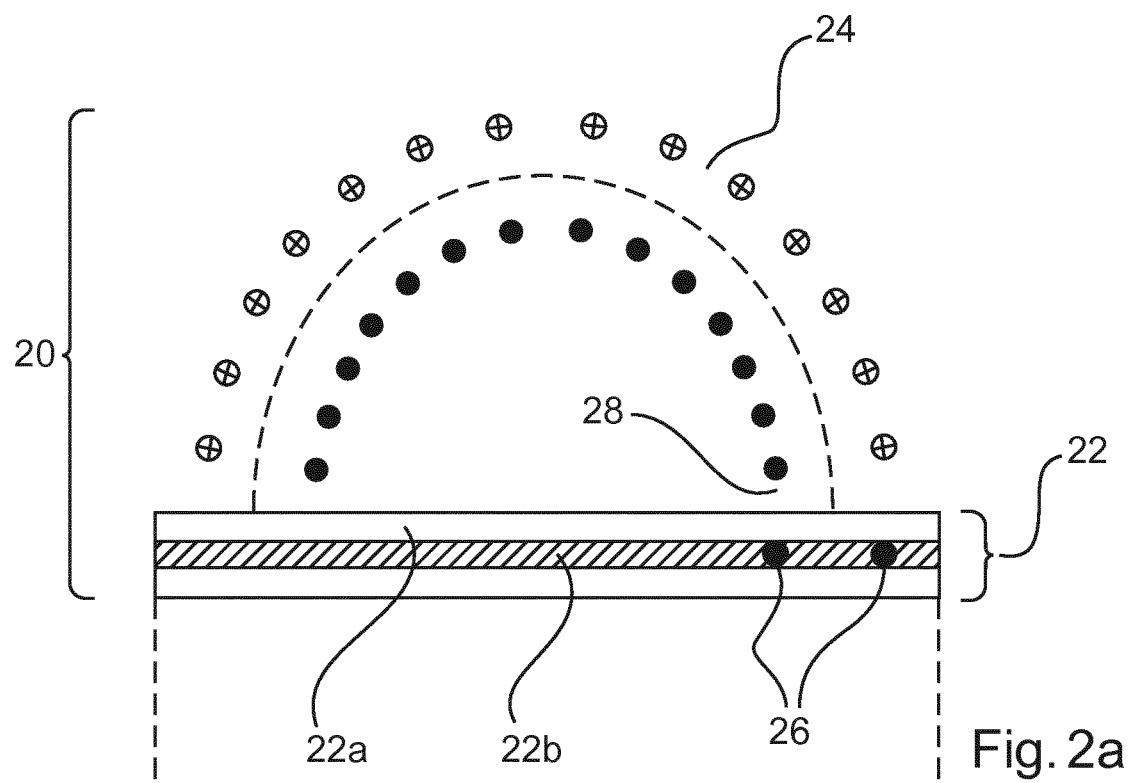
FIG. 2 schematically illustrates a side view, and a top-down view of an air-core inductor assembly.

FIG. 2a) schematically illustrates a side view of an air-core assembly according to the first aspect.

Figure 2B:
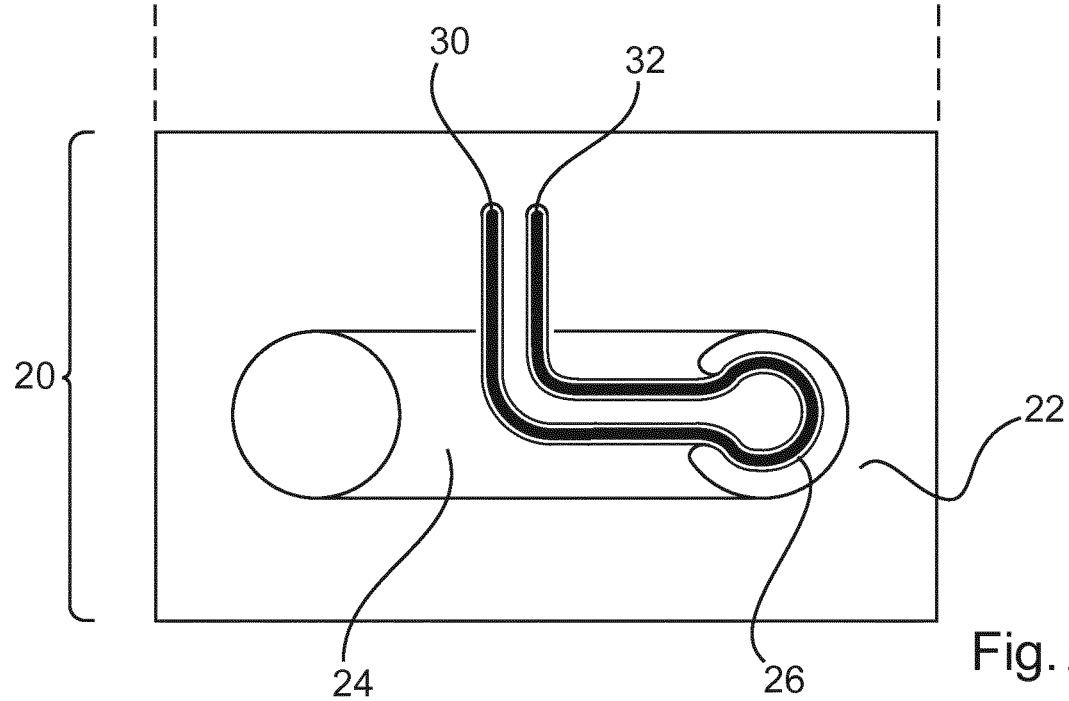

FIG. 2b) schematically illustrates a top-down view of the air-core assembly illustrated in FIG. 2a), in the same alignment.

In an exemplary embodiment, an air-core inductor assembly 20 is provided as a printed circuit board 22 upon which a first inductor coil 24 is mounted. As illustrated, the printed circuit board 22 is a single-layer printed circuit board having a top-layer 22a and a bottom layer made from a glass-reinforced plastic such as FR4, for example, with a conductive copper layer 22b adhesively attached to the glass-reinforced plastic top-layer 22a. The first inductor coil 24 is provided, in this example, as a heavy-gauge Litz wire that is stiff enough to enable the first inductor coil 24 to stand without a separate support. Optionally, a support (such as a plastic format) may be provided to support thinner gauges of Litz wire.

The current sensor 26 is provided as a specific track in the conductive copper layer 22b. FIG. 2b) shows a top-down view of the printed circuit board 22 of FIG. 2a) with the first inductor coil 24 illustrated using dotted lines, and the current sensor 26 formed by a printed circuit board trace (fabricated in the copper layer 22b of the printed circuit board) illustrated using a thick black line.

It will be seen that a portion 28 of the semicircular-formed first inductor coil 24 abuts the top surface of the printed circuit board 22. Within the diameter delineated by the portion 28 of the first inductor coil 24, a substantially loop-shaped current sensor 26 is provided as a printed circuit board trace. Both ends of the trace lead to terminations 30 and 32, which may be connected to a instrumentation amplifier, an impedance matching network, and ultimately an X-ray power control system.

In operation, an alternating current flows in both directions through the first inductor coil 24, establishing a rapidly fluctuating magnetic field inside the air-core of the first inductor coil 24. Because the first inductor coil 24 is arranged in proximity to the printed circuit board trace forming the current sensor 26, some of the energy contained in the rapidly fluctuating magnetic field is picked up by the current sensor 26, inducing a voltage across the terminals 30 and 32 that is a representative proxy for the current flowing inside the first inductor coil 24.

Optionally, the term "in proximity" means that the portion 28 of the first inductor coil 24 is in physical contact with the (non-conducting) surface of the printed circuit board 22. The term "in proximity" can alternatively mean that the portion 28 of the first inductor coil 24 is separated from the non-conducting surface of the printed circuit board 22 by a distance which is smaller than 1 mm, smaller than 2 mm, smaller than 3 mm, smaller than 4 mm, smaller than 5 mm, or smaller than 1 cm. Dependent upon the chosen operating condition, for example the switching frequency of the resonant converter, the current flowing through the resonant converter, the inductance of the first inductor coil 24, different distances between the portion 28 of the first inductor coil 24 and the surface of the printed circuit board 22 may be acceptable provided a flux linkage between the portion 28 of the first inductor coil 24 and the current sensor 26 can be established. Optionally, the use of an instrumentation amplifier and/or an impedance matching network can improve the magnitude of the sensed signal, thus relaxing the proximity constraint between the portion 28 of the first inductor coil and the surface of the printed circuit board 22.

Optionally, the first inductor coil 24 is toroidal.

It will be appreciated that "the portion" 28 of the first inductor coil 24 is illustrated as an end portion of the first inductor coil 24 in FIGS. 2a) and 2b). However, an optional embodiment in which the first inductor coil 24 is a cylindrical air core inductor disposed on the upper (non-conducting) surface of the printed circuit board 22 is also envisaged, and in this case the current sensor 26 can be provided as a printed circuit board trace running along the path of the cylindrical inductor coil. The skilled person will appreciate that many shapes and dispositions of inductor coil could be used.

Optionally, the portion 28 of the first and/or second inductor coil is an end, or terminal, portion of the inductor coil.

Although not illustrated, it will be appreciated that multi-layer printed circuit boards can be exploited to improve the inductance of the current sensor 26. For example, a two-layer printed circuit board could provide two, series-connected current sensors, connected together by means of "vias" between printed circuit board layers. Without limitation, this concept is applicable to printed circuit boards having three, four, five, or a large plurality of multiple layers.

FIG. 3 schematically illustrates different current sensor designs that can be fabricated in a printed circuit board.

Figure 3A:
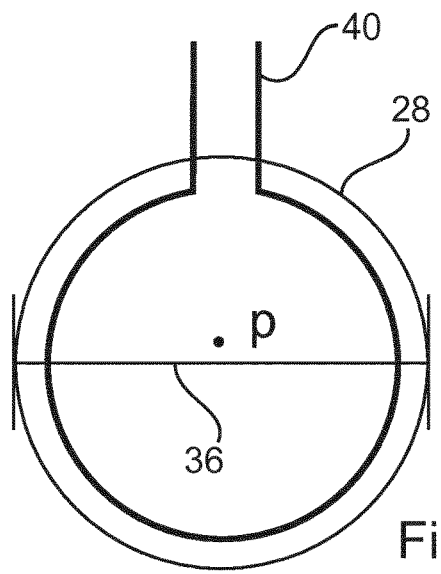
FIG. 3 schematically illustrates different current sensor configurations.

FIG. 3a) illustrates a bottom-up view of a current sensor, with the end diameter 36 of a terminal portion 28 traced as a circle. The first current sensor form is a circular loop 40 in the copper layer of the printed circuit board substantially tracing a path around the inside of the end portion of the first inductor coil 24.

Figure 3C:
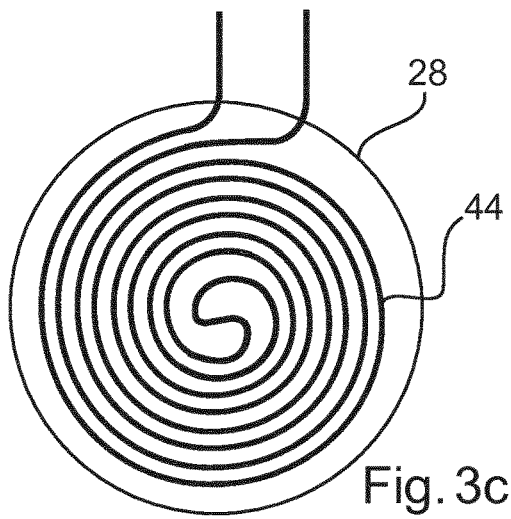
Figure 3B:
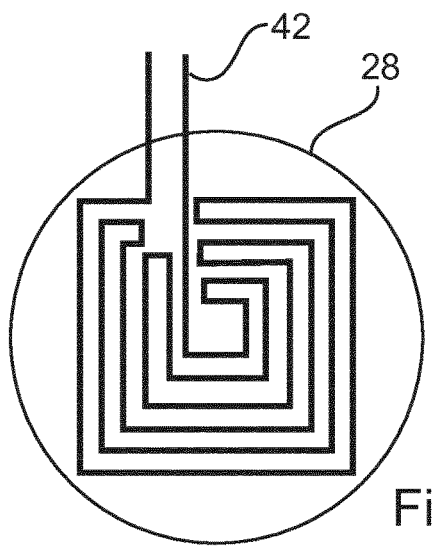

FIG. 3b) illustrates a bottom-up view of a current sensor 26 in the form of a square spiral track 42 in the copper layer of the printed circuit board bounded by the tracing of the terminal portion 28 of the first inductor coil 24.

FIG. 3c) illustrates a bottom-up view of a current sensor 26 in the form of a circular spiral pattern 44 in the copper layer of the printed circuit board bounded by the tracing of the terminal portion 28 of the first inductor coil 24.

Figure 3D:
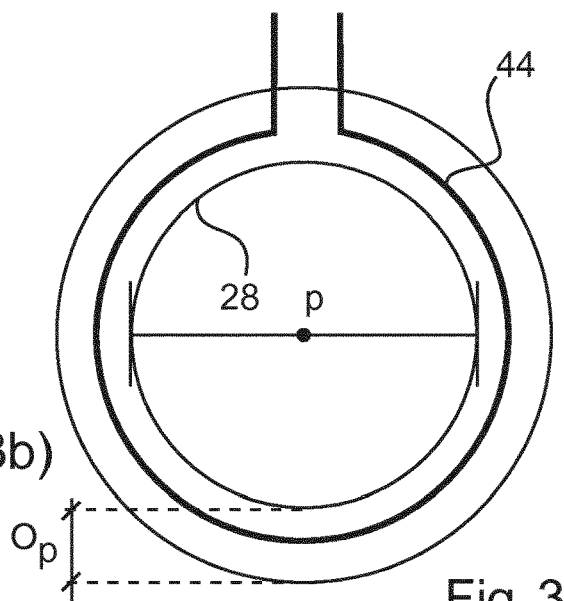

FIG. 3d) illustrates a bottom-up view of a current sensor 26 forming a loop 44 marginally outside the boundary defined by the tracing of the terminal portion 28 of the first inductor coil 24. This is to enable the fringe field, which may still be detectable with sensitive instrumentation, to be picked up in the outer diameter OD outside the extent of the terminal portion 28.

Hitherto, the printed circuit board 22 of the air-core inductor assembly has been discussed as a flat panel having no holes from front to back. Optionally, a hole-shaped aperture can be provided through the printed circuit board, for example to enable a wire connection 48 from the first inductor coil 24 to be returned from one side of the printed circuit board to the other side of the printed circuit board, for example to enable the first inductor coil 24 to be electrically connected to a printed circuit board trace on the opposite side of the printed circuit board 22 to the side accommodating the first inductor coil 24.

Figure 3E:
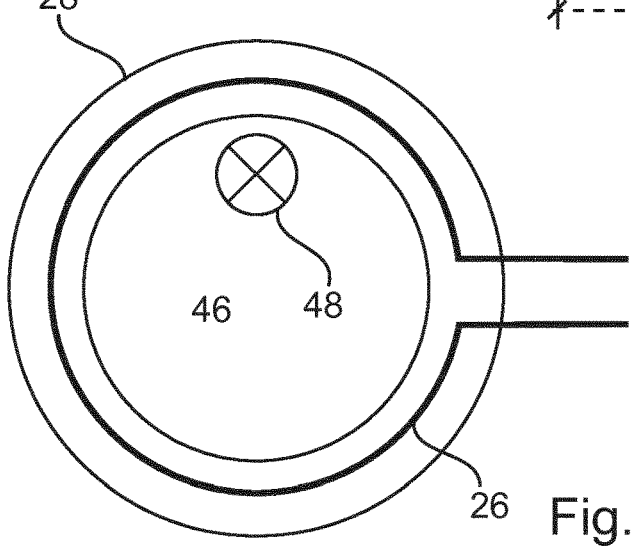

FIG. 3e) illustrates a loop-shaped current sensor 26 formed inside the diameter defined by a terminal portion 28 of the first inductor coil 24 (as illustrated in FIG. 3a), although an aperture 46 has been provided through the area of the printed circuit board traced by a terminal portion 28 of the first inductor coil 24, to enable a wire connection 48 to be made from one side of the printed circuit board to the opposite side of the printed circuit board.

Figure 4:
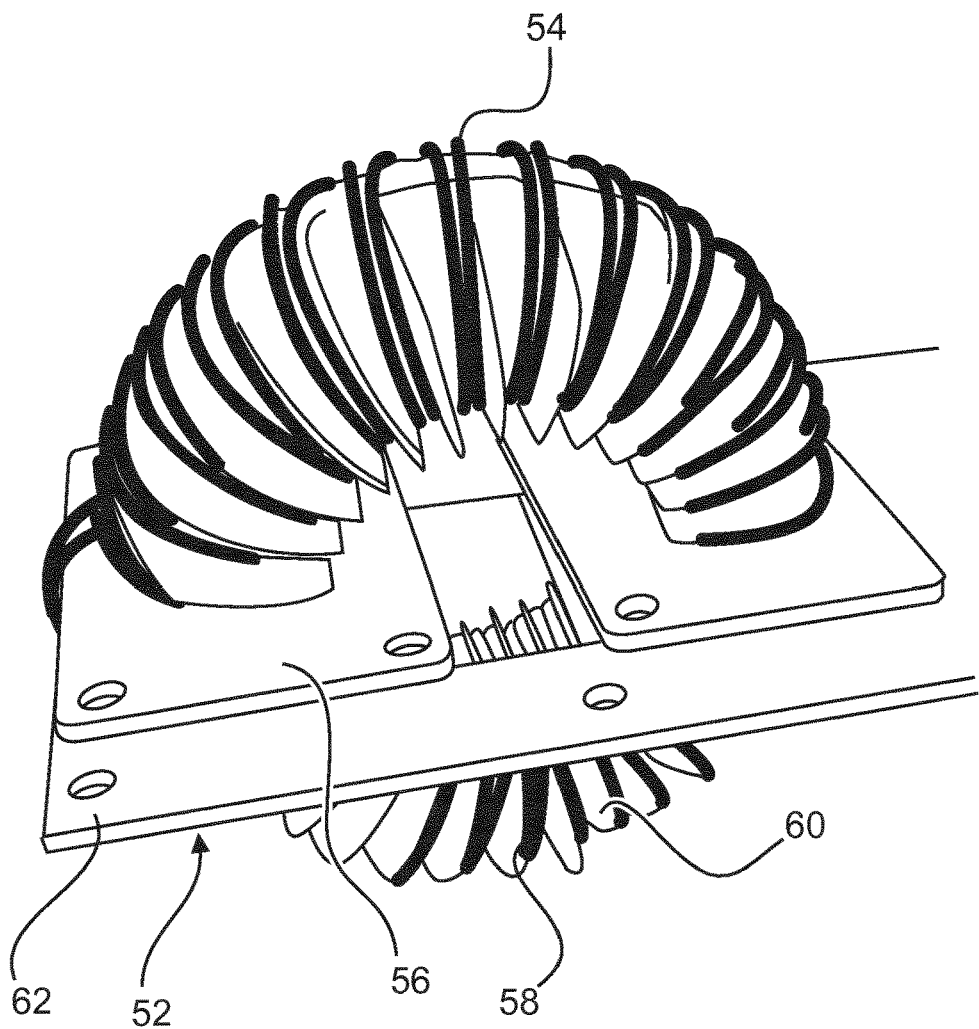
FIG. 4 illustrates an isometric view of an assembled air-core inductor assembly comprising a support element.
Figure 5:
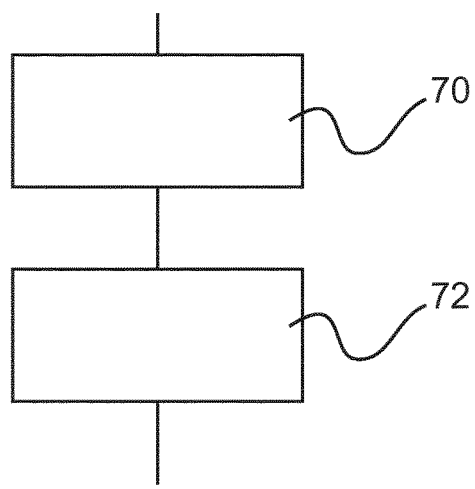
FIG. 5 illustrates a method of manufacturing an air-core inductor assembly.

FIG. 4 illustrates a practical example of an air-core inductor assembly 52 as discussed previously. This example illustrates a first inductor coil 54 formed on a first coil support 56, and a second inductor coil 58 formed on a second coil support 60. It will be appreciated that when wire used for the first inductor coil 54 is of a heavy enough gauge, a coil support 56 is not required. A coil support 56 can, for example, be provided as a semicircular plastic component having fins to enable the regular distribution of wire coils. The first coil support 56 and second coil support 60 are affixed to a printed circuit board 62. In the illustrated case, the current sensor 26 is not shown (it is obscured by the ends of the first coil support 56). However, the printed circuit board 62 of this example comprises a etched copper track in accordance with the described examples above.

According to an aspect, there is provided a resonant power supply assembly comprising the air-core inductor assembly 20 described above.

According to an aspect, there is provided a resonant multi-stage filter comprising a first air-core inductor assembly and a second-core inductor assembly as discussed above.

The first air-core inductor assembly is connectable in series with a load element, and the second air-core inductor assembly is connectable in parallel with the load element, enabling a complex power metric to be calculated based on the measurement of the flux provided by the current sensors of the first and second air-core inductor assemblies.

When using air core inductors as part of a resonant multistage filter (series inductor and parallel inductor), the complex power (U*I) to the load can be detected by measuring the magnetic flux through one series inductor (giving complex amplitude I) and one parallel inductor (giving complex amplitude U). This is as illustrated in the schematic of FIG. 1. In the illustrated case, the pickup (current sensor) configured to detect current in toroid 12 provides a pickup signal proportional to I and the pickup (current sensor) configured to detect current in toroid 14 provides a desired pickup signal proportional to U.

Optionally, the inductor current may be calculated by a feedback circuit by integrating the induced voltage. When considering currents with only one dominant frequency component, the induced voltage amplitude is directly proportional to the current amplitude. A scaling factor may be obtained by calculation, or a calibration measurement. Advantageously, an air-core inductor assembly according to the first aspect has a current sensor 26 which is fixed in shape, position, and orientation. As such, it enables reproducible measurements having long-term stability.

Optionally, the current sensor 26 is part of a power supply system printed circuit board. Furthermore, the air-core inductor may be realised as to half-toroid is, as illustrated in FIG. 4, mounted back-to-back on the printed circuit board, with a current sensor 26 in-between the respective end portions of the first and second half toroids.

According to an aspect, there is provided a kit of parts comprising a printed circuit board and a first inductor coil as discussed in the exemplary options above.

According to an aspect, there is provided a method comprising:

a) manufacturing 70 a printed circuit board having a current sensor formed integrally with the printed circuit board;

b) providing 72 a portion of a first inductor coil mounted on the printed circuit board, wherein a portion of the first inductor coil is arranged in proximity to the current sensor, thus enabling the current sensor to provide a measurement of the flux present in the first inductor coil in use.

Ubiquitously, printed circuit boards are designed and tested using computers.

According to a fourth aspect of the invention, there is provided a computer program product comprising instructions for controlling an apparatus as previously described, or an X-ray imaging arrangement according to the previous description, which, when being executed by a processing unit, is adapted to perform the method steps as previously described.

Such a computer program product may comprise, for example, a common file format used to transfer printed circuit board designs, such as ODB++, standard Gerber (RS-274-D), extended Gerber (RS-274X), EDIF, or ISO 10303-210.

According to a fifth aspect of the invention, there is provided a computer-readable medium having stored the computer program product as previously described. A computer program element might therefore be stored on a computer unit, which might also be an embodiment of the present invention. This computing unit may be adapted to perform or induce performance of the steps of the method described above. Moreover, it may be adapted to operate the components of the above-described apparatus.

The computing unit can be adapted to operate automatically and/or execute orders of a user. A computer program may be loaded into the working memory of a data processor. The data processor may thus be equipped to carry out the method of the invention.

This exemplary embodiment of the invention covers both the computer program that has the invention installed from the beginning, and a computer program that by means of an update turns an existing program into a program that uses the invention. A computer program may be stored and/or distributed on a suitable medium, such as an optical storage medium, or a solid state medium supplied together with, or as part of other hardware, but may also be distributed in other forms, such as via the Internet or other wired or wireless telecommunication systems.

However, the computer program may also be presented over a network like the World Wide Web, and can be downloaded into the working memory of a data processor from such a network. According to a further exemplary embodiment of the present invention, a medium for making a computer program element available for downloading is provided, which computer program element is arranged to perform a method according to one of the previously described embodiments of the invention.

It should to be noted that embodiments of the invention are described with reference to different subject-matters. In particular, some embodiments are described with reference to method-type claims, whereas other embodiments are described with reference to device-type claims. However, a person skilled in the art will gather from the above, and the following description that, unless otherwise notified, in addition to any combination of features belonging to one type of subject-matter, other combination between features relating to different subject-matters is considered to be disclosed with this application.

All features can be combined to provide a synergetic effect that is more than the simple summation of the features.

While the invention has been illustrated and described in detail in the drawings and foregoing description, such illustration and description are to be considered illustrative or exemplary, and not restrictive. The invention is not limited to the disclosed embodiments.

Other variations to the disclosed embodiments can be understood, and effected by those skilled in the art in practicing the claimed invention, from a study of the drawings, the disclosure, and the dependent claims.

In the claims, the word "comprising" does not exclude other elements or steps, and the indefinite article "a" or "an" does not exclude a plurality. A single processor, or other unit, may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. An air-core inductor assembly, comprising:
   a printed circuit board comprising a current sensor; and
   a portion of a first air-core inductor coil mounted on the printed circuit board,
   wherein the current sensor is formed integrally with the printed circuit board, and wherein the portion of the first air-core inductor coil is arranged in proximity to the current sensor to provide an electromagnetic coupling in use in order to enable the current sensor to provide a measurement of the flux present in the first air-core inductor coil.

2. The air-core inductor assembly according to claim 1, wherein the current sensor is formed from a printed circuit board trace.

3. The air-core inductor assembly according to claim 2, wherein the printed circuit board trace forms at least one of a loop, a spiral, and a square spiral track inside a portion of the printed circuit board defined by an outer diameter of the portion of the first air-core inductor coil.

4. The air-core inductor assembly according to claim 1, wherein the printed circuit board trace forms at least one of a loop, a spiral, and a square spiral track outside a portion of the printed circuit board defined by an outer diameter of the portion of the first air-core inductor coil until a terminal diameter, such that the current sensor provides an electromagnetic coupling to portions on an outer side of the portion of the first air-core inductor coil.

5. The air-core inductor assembly according to claim 1, wherein the printed circuit board further comprises a through-hole inside a portion of the printed circuit board defined by an outer diameter of the portion of the first air-core inductor coil, and wherein a wire connection of the first air-core inductor coil is routed via the through-hole to an opposite side of the printed circuit board.

6. The air-core inductor assembly according to claim 1, wherein the printed-circuit board is a multiple-layer printed circuit board, wherein the current sensor is formed from a plurality of printed circuit board traces located on a plurality of the multiple layers, and wherein the printed circuit board traces are connected in a series or parallel configuration using printed circuit board vias between the layers.

7. The air-core inductor assembly according to claim 1, further comprising:
   a second air-core inductor coil disposed on the opposite side of the printed circuit board to the first air-core inductor coil, and being in alignment with the first air-core inductor coil to enable a flux coupling between the first air-core inductor coil and second air-core inductor coil.

8. The air-core inductor assembly according to claim 1, further comprising:
   a first coil support on the printed circuit board, wherein the first air-core inductor coil is supported on the first coil support.

9. A method for manufacturing an air-core conductor assembly, comprising:
   manufacturing a printed circuit board having a current sensor formed integrally with the printed circuit board; and
   providing a portion of a first air-core inductor coil mounted on the printed circuit board, wherein the portion of the first air-core inductor coil is arranged in proximity to the current sensor to enable the current sensor to provide a measurement of flux present in the first air-core inductor coil.

10. The air-core inductor assembly according to claim 7, wherein the first air-core inductor assembly and the second air core assembly form a resonant multi-stage filter.

11. The air-core inductor assembly according to claim 10, wherein the first air-core inductor assembly is connectable in series with a load element and the second air-core inductor assembly is connectable in parallel with the load element to enable a complex power metric to be calculated based on a measurement of flux.

* * * * *